(12) United States Patent
Heng et al.

(10) Patent No.: US 8,484,537 B1
(45) Date of Patent: Jul. 9, 2013

(54) SYSTEMS AND METHODS FOR DATA-PATH PROTECTION

(75) Inventors: Tang Heng, San Jose, CA (US); Gregory Burd, San Jose, CA (US); Soichi Isono, Kanagawa (JP); Son Hong Ho, Los Altos, CA (US); Vincent Wong, Fremont, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 410 days.

(21) Appl. No.: 12/950,779

(22) Filed: Nov. 19, 2010

Related U.S. Application Data

(63) Continuation of application No. 11/711,286, filed on Feb. 27, 2007, now Pat. No. 7,840,878.

(60) Provisional application No. 60/790,923, filed on Apr. 11, 2006.

(51) Int. Cl.
*G11C 29/00* (2006.01)
*H03M 13/00* (2006.01)

(52) U.S. Cl.
USPC ............................ 714/770; 714/769; 714/755

(58) Field of Classification Search
USPC ......................................... 714/769, 770, 755
See application file for complete search history.

(56) References Cited

U.S. PATENT DOCUMENTS

| | | | |
|---|---|---|---|
| 5,089,958 A | 2/1992 | Horton et al. | |
| 5,195,100 A | 3/1993 | Katz et al. | |
| 5,233,618 A | 8/1993 | Glider et al. | |
| 5,313,585 A | 5/1994 | Jeffries et al. | |
| 5,469,453 A | 11/1995 | Glider et al. | |
| 5,475,697 A | 12/1995 | Katz et al. | |
| 5,581,715 A | 12/1996 | Verinsky et al. | |
| 5,589,998 A | 12/1996 | Yu | |
| 5,600,662 A | 2/1997 | Zook | |
| 5,602,857 A | 2/1997 | Zook et al. | |
| 5,629,949 A * | 5/1997 | Zook ............................ | 714/769 |
| 5,691,994 A * | 11/1997 | Acosta et al. ................. | 714/784 |
| 5,696,775 A * | 12/1997 | Nemazie et al. .............. | 714/805 |
| 5,758,054 A | 5/1998 | Katz et al. | |
| 5,805,799 A * | 9/1998 | Fredrickson et al. ........... | 714/52 |
| 6,012,839 A * | 1/2000 | Nguyen et al. ................ | 714/755 |
| 6,098,190 A | 8/2000 | Rust et al. | |
| 6,125,469 A | 9/2000 | Zook et al. | |
| 6,367,047 B1 | 4/2002 | McAuliffe et al. | |
| 6,381,706 B1 | 4/2002 | Zaczek | |
| 6,467,060 B1 * | 10/2002 | Malakapalli et al. ......... | 714/758 |
| 6,546,440 B1 | 4/2003 | Verinsky et al. | |
| 6,553,511 B1 | 4/2003 | DeKoning et al. | |

(Continued)

*Primary Examiner* — Joseph D Torres

(57) ABSTRACT

A system including a first buffer module, a first encoder module, a control module, and a second buffer module. The first buffer module receives (i) a first block and (ii) a first logical block address (LBA) for the first block from a host, where the first block includes first data. The first encoder module generates a first checksum based on (i) the first data and (ii) the first LBA. The control module generates a second block, where the second block includes (i) the first data, (ii) the first LBA, and (iii) the first checksum. The second buffer module receives a third block from the first buffer module, where the third block includes a second LBA. The second buffer module determines whether the third block is different than the first block depending on whether the second LBA in the third block is different than the first LBA in the second block.

20 Claims, 16 Drawing Sheets

U.S. PATENT DOCUMENTS

| | | | |
|---|---|---|---|
| 6,574,774 B1 * | 6/2003 | Vasiliev | 714/800 |
| 6,584,527 B2 | 6/2003 | Verinsky et al. | |
| 6,636,908 B1 | 10/2003 | Winokur et al. | |
| 6,654,862 B2 | 11/2003 | Morris | |
| 6,711,659 B2 | 3/2004 | Miller et al. | |
| 6,721,828 B2 | 4/2004 | Verinsky et al. | |
| 6,728,855 B2 | 4/2004 | Thiesfeld et al. | |
| 6,751,757 B2 * | 6/2004 | Biskup et al. | 714/54 |
| 6,799,283 B1 * | 9/2004 | Tamai et al. | 714/6.12 |
| 6,934,725 B1 | 8/2005 | Dings | |
| 6,968,404 B2 | 11/2005 | Verinsky et al. | |
| 6,981,171 B2 | 12/2005 | Hashemi | |
| 7,111,228 B1 | 9/2006 | Ricci | |
| 7,178,086 B2 | 2/2007 | Hassner et al. | |
| 7,239,547 B2 | 7/2007 | Suda | |
| 7,313,721 B2 | 12/2007 | Ashmore | |
| 7,418,645 B2 * | 8/2008 | Srivastava | 714/758 |
| 7,559,009 B1 | 7/2009 | Ricci | |
| 7,617,352 B2 | 11/2009 | Mukaida et al. | |
| 7,647,544 B1 | 1/2010 | Masiewicz | |
| 2003/0097520 A1 * | 5/2003 | Lai et al. | 711/103 |

* cited by examiner

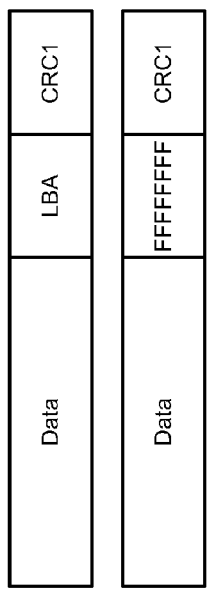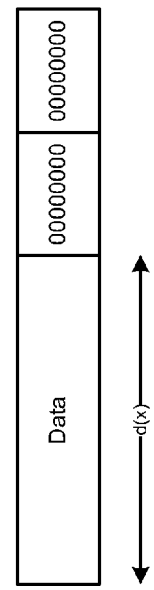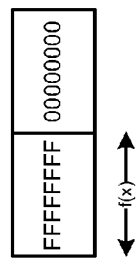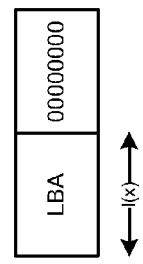
FIG. 5C
FIG. 5D
FIG. 5E
FIG. 5F

SYSTEMS AND METHODS FOR DATA-PATH PROTECTION

CROSS-REFERENCE TO RELATED APPLICATIONS

This application is a continuation of U.S. application Ser. No. 11/711,286 (now U.S. Pat. No. 7,840,878), filed on Feb. 27, 2007, which claims the benefit of U.S. Provisional Application No. 60/790,923, filed on Apr. 11, 2006. The disclosure of the above application is incorporated herein by reference in its entirety.

FIELD

The present disclosure relates to data processing systems, and more particularly to detecting and correcting errors in read and write data-paths in disk drives.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

In recent years, use of large-scale networks that exchange, process, and store large amounts of data at high speed is proliferating. Consequently, demand for reliable data storage systems is increasing. Particularly, engineers strive to design error detecting/correcting systems that can write data on disk drives in a manner that will enable detecting and correcting errors when the data is read back.

For example, an encoder may encode the data using one or more error-correcting codes such as Reed-Solomon codes before writing the data on a disk drive. When the data is read back, a decoder may decode the data and detect and/or correct errors. The ability of systems to detect and/or correct errors depends on types of error and error-correcting capabilities of codes used to encode the data.

Data is typically read from disks in sectors or blocks. Data read from a disk is considered reliable if the data read is the same as the data that was written on the disk. To enable error-detection when data is read from a disk, a cyclic redundancy check (CRC) is performed on the data before the data is written on the disk. CRC for a block is typically generated as follows. A polynomial is used to represent the data in the block. The polynomial is divided by a predetermined binary polynomial. A remainder resulting from the division is called a checksum of the data. The checksum is appended to the block before the block is written and stored in the disk.

When the block is read from the disk, the same division is performed, and the remainder of the division is compared to the checksum in the block. The data in the block is considered reliable if the remainder matches the checksum. Typically, a logical block address (LBA) is associated with each block. The LBA indicates an address or a location where the block is stored in the disk. In addition to protecting the data in the block, the CRC may protect the LBA information of the block.

CRC, however, may not detect errors when data read differs from data written due to an error and yet generates identical remainders in read and write operations. An error-correcting code (ECC), on the other hand, enables not only detection but also correction of some errors that may be detected in the block when the block is read from the disk. Typically, an error-correcting code such as a Reed-Solomon code is used to calculate parity for the block. The parity is appended to the block to generate a codeword, and the codeword is stored in the disk.

When the block is read from the disk, a calculation is performed to determine if the block read is a valid codeword. The data in the block is considered error-free if the block read is a valid codeword. If errors are detected, a decoder may try to correct the error. Correct data can be reconstructed if the number of errors is less than or equal to an error-correcting capability of the code used.

Referring now to FIG. 1, a data processing system 10 may include a processor 12, a hard disk drive (HDD) 14, a host adapter 16, and system memory 18. The processor 12, the host adapter 16, and system memory 18 may communicate via a system bus 20. The HDD 14 may communicate with the host adapter 16 via a standard I/O interface 24 such as ATA, SATA, etc.

The host adapter 16 may read the data from the disk drive 14 into system memory 18. The processor 12 may read the data from system memory 18 and process the data in system memory 18. The host adapter 16 may read the processed data from system memory 18 and store the processed data in the HDD 14.

Referring now to FIG. 2, the HDD 14 may include a hard disk assembly (HDA) 14-1 and a HDD printed circuit board (PCB) 14-2. The HDA 14-1 may include one or more circular platters 15 having a magnetic medium that is used to store data magnetically. Data is stored in binary form as a magnetic field of either positive or negative polarity. The platters 15 are arranged in a stack, and the stack is rotated by a spindle motor 17. At least one read/write head (hereinafter "head") 19 reads data from and writes data on the platters 15.

Each head 19 may include a write element such as an inductor that generates a magnetic field and a read element such as a magneto-resistive (MR) element that senses the magnetic field on the platters 15. The head 19 may be mounted at a distal end of an actuator arm 22. An actuator such as a voice coil motor (VCM) 23 may move the actuator arm 22 relative to the platters 15.

The HDA 14-1 may include a preamplifier device 26 that amplifies signals received from and sent to the head 19. When writing data, the preamplifier device 26 may generate a write current that flows through the write element of the head 19. The write current may be switched to produce a positive or negative magnetic field on the platters 15.

When reading data, the magnetic fields stored on the platters 15 induce low-level analog signals in the read element of the head 19. The preamplifier device 26 amplifies the low-level analog signals and outputs amplified analog signals to a read/write channel (hereinafter "read-channel") module 28.

The HDD PCB 14-2 may include the read-channel module 28, a hard disk controller (HDC) module 30, a processor 32, a spindle/VCM driver module 34, a buffer 36, nonvolatile memory 38, and the I/O interface 24. During write operations, the read-channel module 28 may encode the data to increase reliability. The read-channel module 28 may use error-correction coding (ECC), run length limited (RLL) coding, Reed-Solomon encoding, etc., to encode the data. The read-channel module 28 may output the encoded data to the preamplifier device 26. During read operations, the read-channel module 28 may receive analog signals from the preamplifier device 26. The read-channel module 28 may convert the analog signals into digital signals, which may be filtered and decoded to recover the original data.

The HDC module 30 controls operation of the HDD 14. For example, the HDC module 30 may generate commands that control the speed of the spindle motor 17 and the movement of the actuator arm 22. The spindle/VCM driver module 34 may implement the commands and generate control signals that control the speed of the spindle motor 17 and the positioning of the actuator arm 22.

The HDC module 30 may communicate with an external device such as the host adapter 16 via the I/O interface 24. The HDC module 30 may receive data to be stored in the HDD 14 from the external device and may transmit data stored in the HDD 14 to the external device. The HDC module 30 may use the buffer 36 to temporarily store data and commands during read/write operations.

The processor 32 may process data, including encoding, decoding, filtering, and/or formatting. Additionally, the processor 32 may process servo or positioning information to position the heads 19 relative to the platters 15 during read/write operations. Servo, which is stored on the platters 15, ensures that data is written to and read from correct locations on the platters 15. In some implementations, a self-servo write (SSW) module 42 may write servo on the platters 15 using the heads 19 prior to storing data on the HDD 14.

During read/write operations, data in HDD 14 may flow through read/write data-paths and may be communicated from one module to another. For example, during a write operation, data may flow through a write data-path. Specifically, data may be received by the I/O interface 24, stored in the buffer 36, encoded and/or formatted by the read-channel module 28, etc. before the data may be written on the platters 15. Similarly, during a read operation, data may flow through a read data-path. Specifically, data read from the platters 15 may be processed by the read-channel module 28, stored in the buffer 36, etc., before the data may be transmitted to the host adapter 16 via the I/O interface 24.

Data may get corrupted when the data is communicated from one module to another in read/write data-paths. For example, data may get corrupted due to noise, physical defects in platters 15, defects in one or more modules, etc. Corrupted data may not be reliable if errors due to corruption are irrecoverable.

SUMMARY

A system comprises a host first-in first-out (FIFO) module, a first encoder module, a control module, a disk FIFO module, and a second encoder module. The host FIFO module receives a block having data and selectively receives a host logical block address (HLBA). The first encoder module generates a first checksum based on the data and the HLBA and generates a first encoded block. The control module appends the HLBA to the first encoded block and generates an appended block. The disk FIFO module receives the block from the host FIFO module. The second encoder module selectively generates a second checksum based on the HLBA and the data in the block received by the disk FIFO module. The second encoder module compares the block received by the disk FIFO module to the block received by the host FIFO module based on the first and second checksums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5C shows two possible values for a logical block address (LBA) of a block read from the platters of a disk drive according to the present disclosure;

FIG. 5D shows an exemplary block having a first portion including data and a second portion including a logical block address (LBA) and a CRC checksum of the block according to the present disclosure;

FIG. 5E shows the second portion of the block of FIG. 5D that includes an escape logical block address (escape LBA) according to the present disclosure;

FIG. 5F shows the second portion of the block of FIG. 5D that includes a logical block address (LBA) according to the present disclosure;

DETAILED DESCRIPTION

Figure 1:
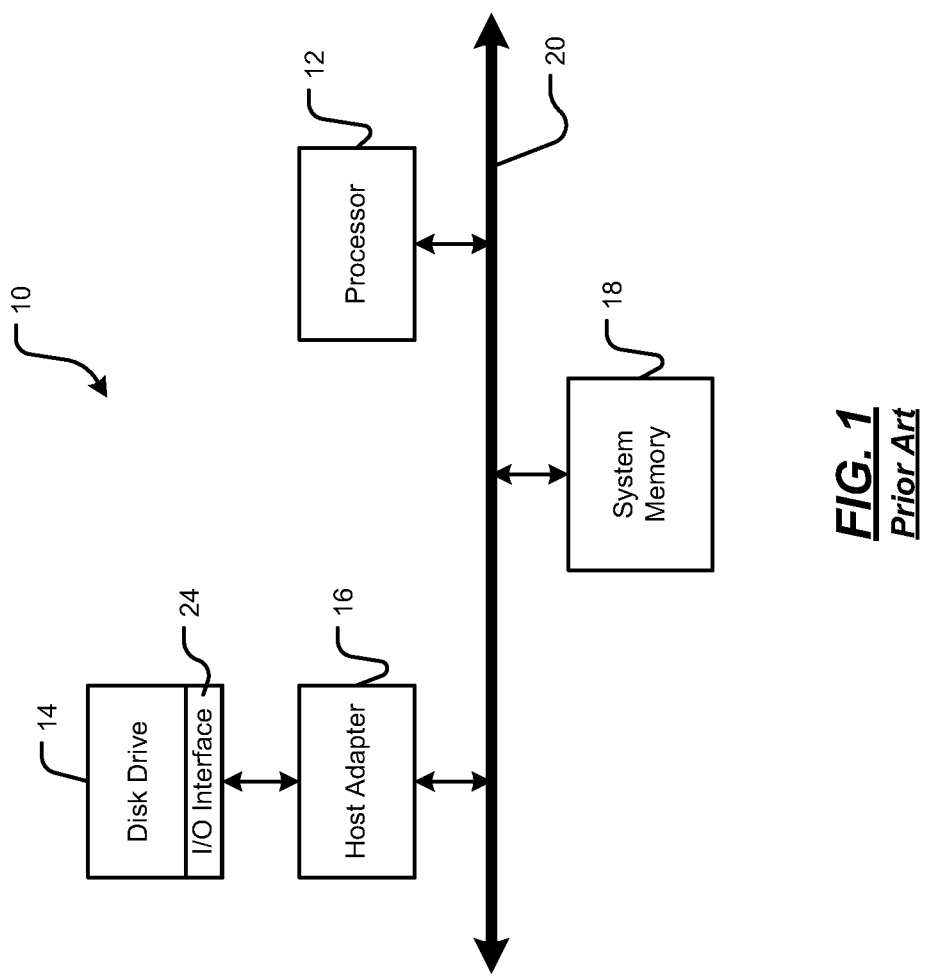
FIG. 1 is a functional block diagram of an exemplary data processing system.
Figure 2:
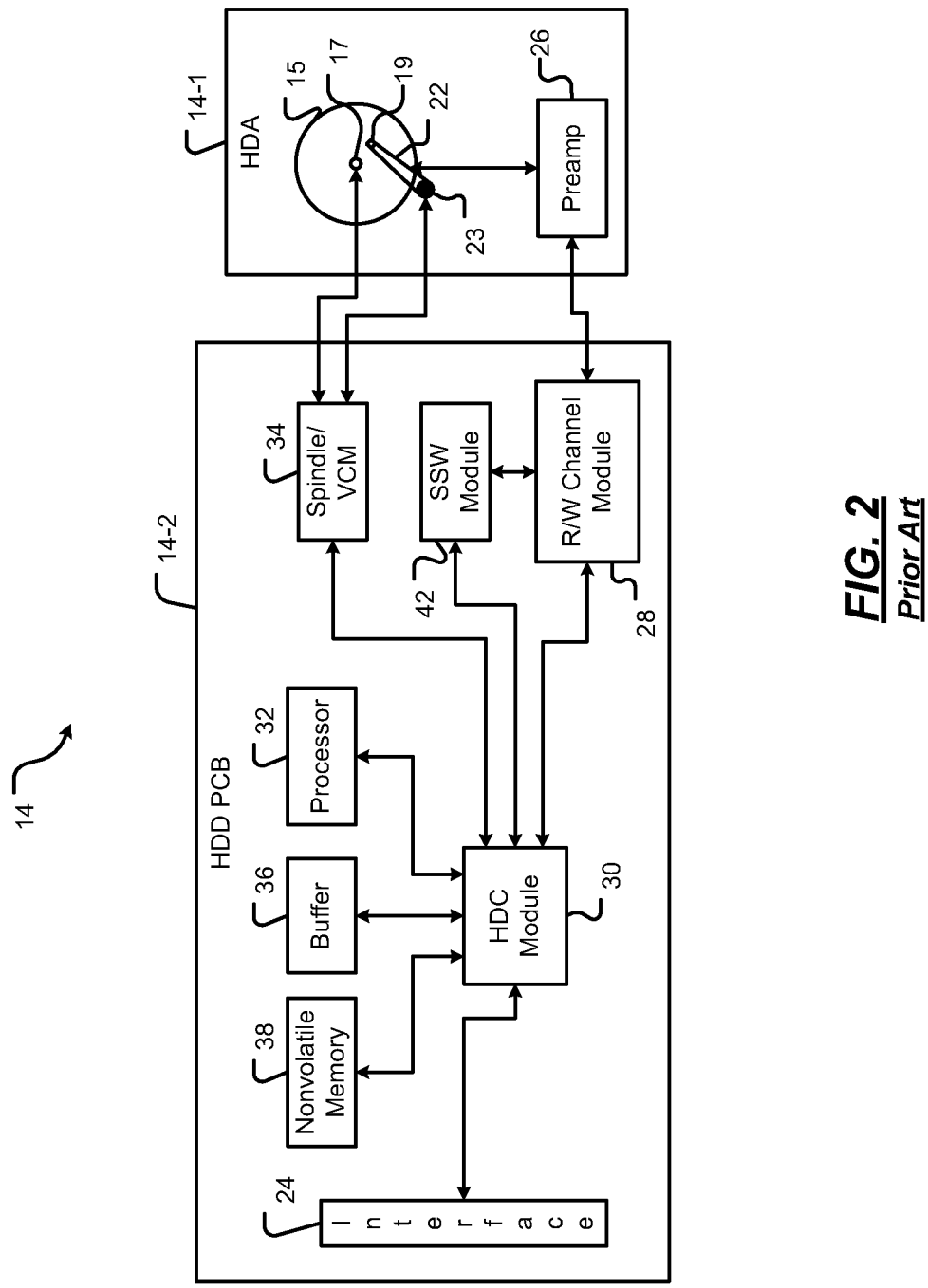
FIG. 2 is a functional block diagram of a disk drive.

The following description is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3A:
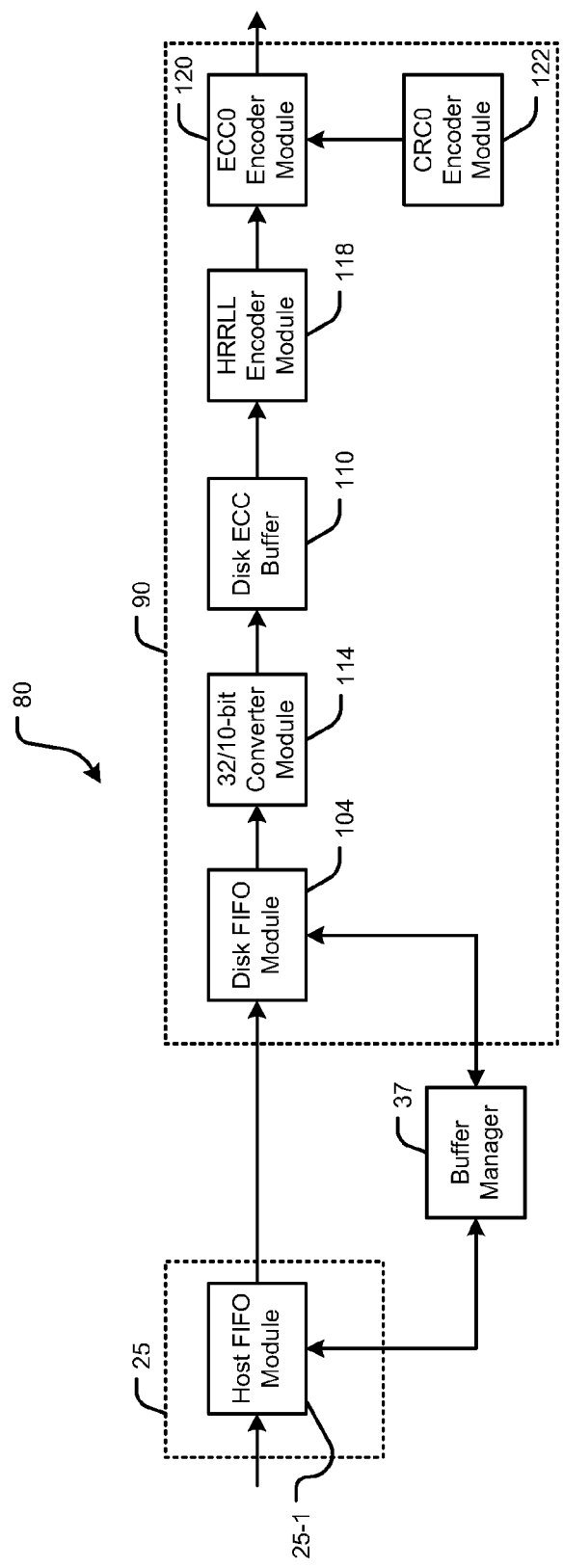
FIG. 3A is a functional block diagram of a write data data-path in a disk drive according to the prior art.

Referring now to FIG. 3A, a write data-path 80 through which data may flow in a disk drive during a write operation is shown. The write data-path 80 may include a host-bus interface (hereinafter "interface") module 25, a buffer manager 37, and a hard disk controller (HDC) module 90. A host device (not shown), such as a processor, may have data that is to be written in the disk drive. The interface module 25 may receive the data from the host device and store the data in a host FIFO (first-in first-out) module 25-1.

Subsequently, the data in the host FIFO module 25-1 is output to a disk FIFO module 104 in the HDC module 90. The buffer manager 37 manages buffering of data in the host FIFO module 25-1 and the disk FIFO module 104. The HDC module 90 may encode the data and forward the encoded data to a read-channel module (not shown). The read-channel module may further encode the data using channel-code encoders before the data is written on the media (i.e., one or more platters) (not shown) of the disk drive.

The HDC module 90 may comprise the disk FIFO module 104, a 32/10-bit converter module 114, a disk ECC buffer 110, a HRRLL (high-rate run length limited code) encoder module 118, an ECC0 encoder module 120, and a CRC0 encoder module 122. The data received by the HDC module 90 may be stored in a disk FIFO module 104. The 32/10-bit converter module 114 converts the data from a 32-bit format to a 10-bit format. The converted data may be stored in the disk ECC buffer 110 while HRRLL, ECC0, and CRC0 encoder modules 118, 120, 122 encode the data.

Each block of data received by the host FIFO module 25-1 from the host device is identified by a unique host logical block address (HLBA). The HLBA is an identifier that the host device uses to identify a location where the block is stored in the disk drive. When the block is read from the host FIFO module 25-1, the HLBA is mapped to a sector physical block address (SPBA), which specifies a location on the media (e.g., zone, track, and sector index) where the block is to be written. A one-to-one correspondence exists between HLBA and SPBA. Integrity of data may be assured only if the block selected from host FIFO module 25-1 corresponds to the HLBA/SPBA address pair that is being processed.

Additionally, data may get corrupted during transfer from one module to another in the write data-path. Consequently, the data received from the host device and the data written on the platters may not be the same. Cyclic redundancy check (CRC) encoder/decoder (endec) modules may be used at various points in the write data-path to ensure data integrity. The CRC endec modules may detect and optionally correct errors in the data at various points in the write data-path. For convenience, all CRC endec modules are hereinafter referred to as endec modules.

Figure 3B:
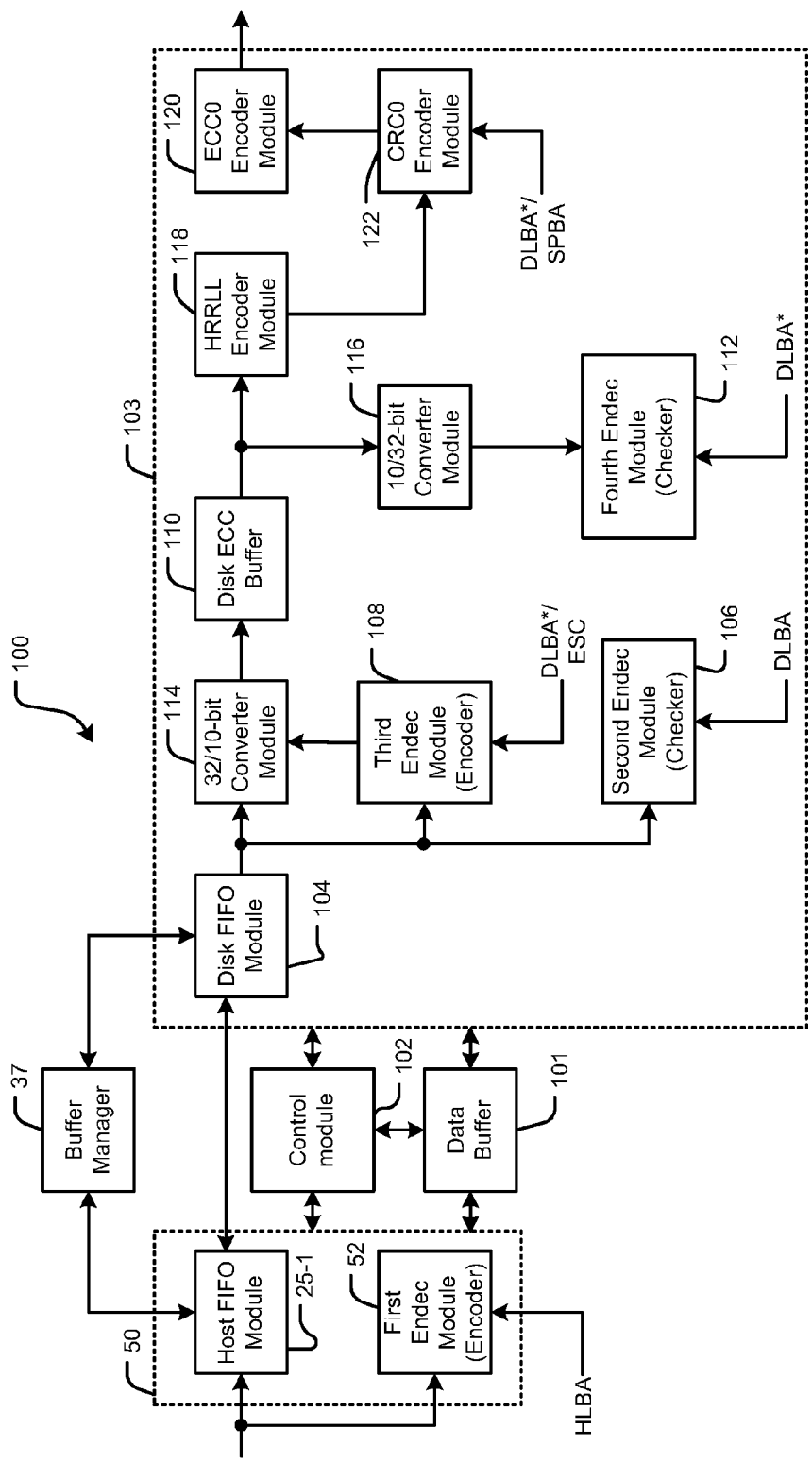
FIG. 3B is a functional block diagram of an exemplary write data-path in a disk drive according to the present disclosure.
Figure 3C:
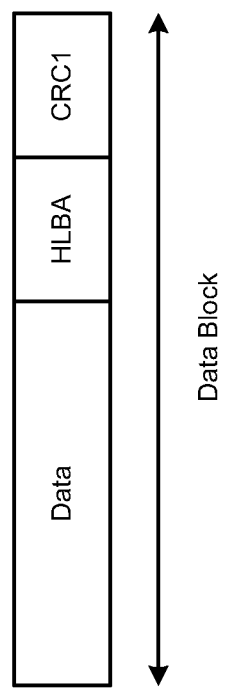
FIG. 3C shows the manner in which a host logical block address (HLBA) is appended in a data buffer according to the present invention.

Referring now to FIGS. 3B-3C, a system 100 for protecting write data-path in a disk drive comprises a host-bus interface (hereinafter "interface") module 50, a buffer manager 37, a control module 102, a data buffer 101, and a HDC module 103. The interface module 50 may include an input/output (I/O) interface such as ATA, SATA, etc. The disk drive may communicate with a host device such as a processor (not shown) via the interface module 50. The interface module 50 may receive data to be written in the disk drive from the host device. The interface module 50 may store the data in a host FIFO (first-in first-out) module 25-1.

Subsequently, the data in the host FIFO module 25-1 is output to a disk FIFO module 104 in the HDC module 103. The buffer manager 37 manages buffering of data in the host FIFO module 25-1 and the disk FIFO module 104. The HDC module 103 encodes the data before the data is forwarded to a read-channel module (not shown) of the disk drive.

Specifically, the interface module 50 comprises the host FIFO module 25-1 and a first encoder/decoder (endec) module 52. The first endec module 52 uses a CRC1 code to encode data. The first endec module 52 encodes data based on a host block-size. The host block-size may or may not be equal to disk block-size (i.e., disk sector size). When the interface module 50 receives a block of data from the host device, the host device may provide a host logical block address (HLBA) for the block.

That is, the host device sends the block and the HLBA for the block to the disk drive when the block is written in the disk drive. Subsequently, when the host device issues a read request to the disk drive for the block, the host device specifies the HLBA of the block to the disk drive. The disk drive reads and sends the block having the specified HLBA to the host device.

The first endec module 52 seeds the block with the HLBA and generates a CRC1 checksum for the block using the CRC1 code. Thus, the CRC1 checksum includes the HLBA information. That is, the HLBA is embedded in the CRC1 checksum of the block.

The control module 102 stores the block including the CRC1 checksum in the data buffer 101. Additionally, to enable subsequent offline error-correction, the control module 102 appends the block in the data buffer 101 with the HLBA as shown in FIG. 3C. When the block is written on the platters, however, only the data and optionally the CRC1 checksum are written. That is, the HLBA, which is appended to the data block in the data buffer 101, is not written on the platters.

The HDC module 103 comprises the disk FIFO module 104, a second endec module 106, a third endec module 108, a disk ECC buffer 110, and a fourth endec module 112. Additionally, the HDC module 103 comprises a 32/10-bit converter module 114, a 10/32-bit converter module 116, a HRRLL encoder module 118, an ECC0 encoder module 120, and a CRC0 encoder module 122.

The second, third, and fourth endec modules 106, 108, 112 may use the same CRC1 code that the first endec module 52 uses to encode and/or decode data. Alternatively, the first, second, third, and fourth endec modules 52, 106, 108, 112, may use other CRC codes. The first and second endec modules 52, 106, however, form a encoder/decoder pair, wherein the second endec module 106 decodes data encoded by the first endec module 52. Consequently, the second endec module 106 may use the same CRC code that is used by the first endec module 52. Similarly, the third and fourth endec modules 108, 112 form a encoder/decoder pair, wherein the fourth endec module 112 decodes data encoded by the third endec module 108. Consequently, the fourth endec module 112 may use the same CRC code that is used by the third endec module 108.

The first, second, third, and fourth endec modules 52, 106, 108, 112 operate in a 32-bit domain. That is, the width of the data input stream to the first, second, third, and fourth endec modules 52, 106, 108, 112 is 32-bit. On the other hand, the disk ECC buffer 110 and the HRRLL, ECC0, and CRC0 encoder modules 118, 120, 122 operate in a 10-bit domain. That is, the width of the data input stream to the disk ECC buffer 110 and the HRRLL, ECC0, and CRC0 encoder modules 118, 120, 122 is 10-bit.

Accordingly, the 32/10-bit converter module 114 converts data from 32-bit to 10-bit domain, and the 10/32-bit converter module 116 converts data from 10 to 32-bit domain. Thus, the second, third, and fourth endec modules 106, 108, 112 can operate in 32-bit domain while the disk ECC buffer 110 and the HRRLL, ECC0, and CRC0 encoder modules 118, 120, 122 can operate in 10-bit domain.

The second and third endec modules 106, 108 determine if an error occurred when data is transmitted from the host FIFO module 25-1 to the disk FIFO module 104. An error may occur, for example, when a block having an incorrect LBA is selected from the host FIFO module 25-1. Such errors may be called LBA errors. Other errors may include random errors, which may occur due to noise, a defect in one or more modules, etc. The system 100 may correct random errors but not LBA errors using offline error-correction. The system 100 may initially determine if an error is an LBA error using the HLBA appended in the data buffer 101 before attempting offline error-correction.

The disk block-size, which is the disk sector size, may be defined when the disk drive is initialized or formatted before the disk drive can be used to store data. On the other hand, the host block-size may be defined by the operating system of the host device. The host block-size may or may not be the same as the disk block-size.

When the host block-size is equal to the disk block-size, the HLBA of the block is the same as a disk logical block address (DLBA), where DLBA is the logical block address used by the disk drive to identify and locate the block stored on the platters. In that case, the control module 102 enables the second endec module 106, which functions as a checker instead of an encoder. The second endec module 106 is seeded with DLBA.

The second endec module 106 compares the LBA information in the block received by the disk FIFO module 104 to the HLBA appended in the data buffer 101. When the LBA information in the block does not match the HLBA, the second endec module 106 determines that an LBA error occurred and generates a control signal indicating that an LBA error occurred. The control signal is communicated to the control module 102.

When the LBA information in the block matches the HLBA, the second endec module 106 computes a CRC1 checksum for the block based on the data in the block received by the disk FIFO module 104. The second endec module 106 compares the computed CRC1 checksum with the CRC1 checksum embedded in the block stored in the data buffer 101.

When the computed and embedded checksums do not match, the second endec module 106 determines that a random error occurred when the block was received by the disk FIFO module 104. In that case, the second endec module 106 generates a control signal indicating that a random error occurred. The control signal is communicated to the control module 102. The control module 102 attempts to correct the checksum. If the attempt fails, the control module 102 generates a control signal to indicate that the random error is not correctable.

Thus, the first and second endec modules 52, 106 protect the host FIFO module 25-1, the data buffer 101, and the disk FIFO module 104. That is, the first and second endec modules 52, 106 determine if an error occurred when the block received from the host device is communicated from the host FIFO module 25-1 to the disk FIFO module 104.

The host block-size, however, may not be equal to the disk block-size. For example, the host block-size may be greater or less than the disk block-size. In that case, after the second endec module 106 performs error-checking, the third endec module 108 encodes the data in the block received by the disk FIFO module 104 and generates a CRC1 checksum using a disk LBA called DLBA* that is calculated by the control module 102.

The control module 102 calculates DLBA* as follows. When the host block-size is greater than the disk block-size, the control module 102 splits the block received from the host device into sub-blocks each having a block-size equal to the disk block-size. An m-bit sub-block ID (i.e., identifier) is used to identify each of the sub-blocks. The control module 102 generates DLBA* by concatenating (32−m) least significant bits (LSBs) of the DLBA with the m-bit sub-block ID.

For example, the host block-size may be 4 Kbyte while the disk block-size may be 512 bytes. In that case, each host block may be split into eight disk blocks. Additionally, the LBA of the host block may have a length of 32 bits. In that case, only 29 LSBs of the 32 bits of the LBA may be written to the disk. Remaining 3 bits of the 32 bits are used as 3-bit sub-block IDs to identify the smaller blocks.

On the other hand, when the host block-size is smaller than the disk block-size, multiple host blocks are merged to form one merged disk block. The control module 102 selects the DLBA of the first block in the merged disk block as the DLBA* of the merged disk block.

Finally, when the host block-size is equal to the disk block-size, DLBA* is the same as DLBA. In that case, the third endec module 108 encodes the data in the block and generates the CRC1 checksum using DLBA.

Alternatively, when data to be written is not supplied by the host device, the control module 102 may enable escape LBA mode. Escape LBA mode is used when data to be written is not supplied by the host device. Consequently, HLBA is unavailable.

In that case, the control module 102 assigns a default or a predetermined LBA called an escape LBA to the block. For example, the escape LBA may be a 32-bit hexadecimal number such as FFFFFFFF. The escape LBA is programmable and may be assigned when the disk drive is initialized or initially setup with escape LBA mode enabled. The third endec module 108 encodes the block and generates a CRC1 code for the block using the escape LBA.

The data from the disk FIFO module 104 and/or the third endec module 108 is converted from a 32-bit to a 10-bit format by the 32/10-bit converter module 114 and is output to the ECC disk buffer 110. The fourth endec module 112, which functions as a checker instead of an encoder, determines if an error occurred during the transfer. Thus, the fourth endec module 112 protects the disk ECC buffer 110.

Specifically, the fourth endec module 112 is seeded with DLBA* that is calculated by the control module 102. The fourth endec module 112 computes a CRC1 checksum of the data in the data block stored in the disk ECC buffer 110 using the DLBA* as a seed. The fourth endec module 112 compares the computed CRC1 checksum to the CRC1 checksum of the data block stored in the data buffer 101. If the two checksums do not match, the fourth endec module 112 determines that an error occurred in the block received by the disk ECC buffer 110. Otherwise, the fourth endec module 112 determines that no error occurred in the block received by the disk ECC buffer 110.

The data stored in the disk ECC buffer 110 is encoded by the HRRLL, ECC0, and CRC0 encoder modules 118, 120, 122. Specifically, the CRC0 encoder module 122 is seeded with DLBA* or a sector physical block address (SPBA). SPBA denotes an actual physical location where the block is written on the platters. The CRC0 encoder module 122 generates a CRC0 checksum of the data in the block using a CRC0 code. The CRC0 encoder module 122 generates an XOR of the SPBA and the CRC0 checksum. The ECC0 encoding module 120 may use an error-correcting code such as a Reed-Solomon code to encode the data in the block including the XOR of the SPBA and the CRC0 checksum. The encoded block is output to the read-channel module.

Figure 4A:
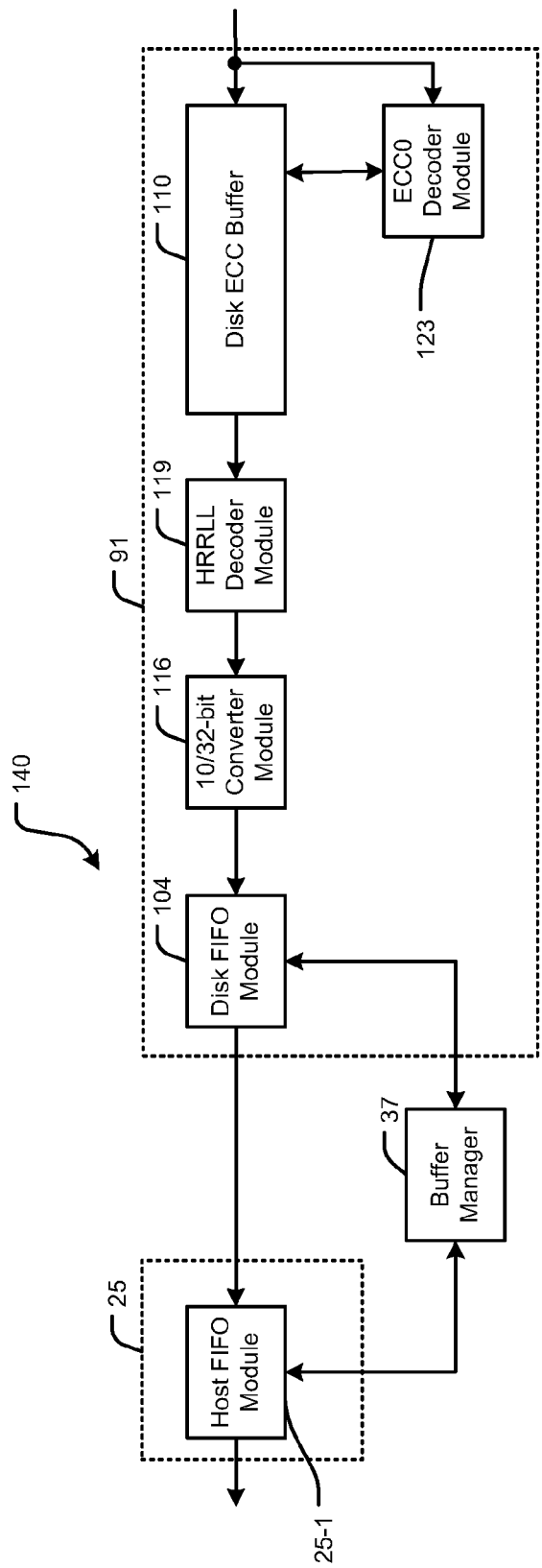
FIG. 4A is a functional block diagram of a read data data-path in a disk drive according to the prior art.

Referring now to FIG. 4A, a read data-path 140 through which data may flow in a disk drive during a read operation is shown. The read data-path 140 may include a host-bus interface (hereinafter "interface") module 25, a buffer manager 37, and a HDC module 91. A host device (not shown) such as a processor may issue a request to read data stored in the disk drive by specifying an LBA (i.e., a requested LBA). A read-channel module (not shown) reads the data stored in the requested LBA and forwards the data to the HDC module 91.

The HDC module 91 processes the data and stores the data in a disk FIFO (first-in first-out) module 104 in the HDC module 91. The data stored in the disk FIFO module 104 is output to a host FIFO module 25-1 in the interface module 25. The buffer manager 37 manages buffering of data in the host FIFO module 25-1 and the disk FIFO module 104. The interface module 25 outputs the data to the host device.

The HDC module 91 may comprise a ECC0 decoder module 123, a disk ECC buffer 110, a HRRLL decoder module 119, a 10/32-bit converter module 116, and the disk FIFO module 104. The ECC0 decoder module 123 decodes the data received from the HDA. The decoded data is stored in the disk ECC buffer 110.

The HRRLL decoder module 119 receives the data from the disk ECC buffer 110 and decodes the data using HRRLL decoding. The 10/32-bit converter module 116 converts the data received from the HRRLL encoder module 119 from a 10-bit domain to a 32-bit domain and outputs the data to the disk FIFO module 104. The disk FIFO module 104 outputs the data to the host FIFO module 25-1. The interface module 25 outputs the data to the host device.

Data may get corrupted when the data is communicated from one module to another in the read data-path. Consequently, the data output to the host device may not be the same as the original data. CRC encoder/decoder modules (hereinafter endec modules) may be employed at various points in the read data-path to ensure that the data output to the host device corresponds to the requested LBA and is error-free. The endec modules detect and correct the data at various points in the read data-path when the data is communicated from one module to another in the read data-path.

Figure 4B:
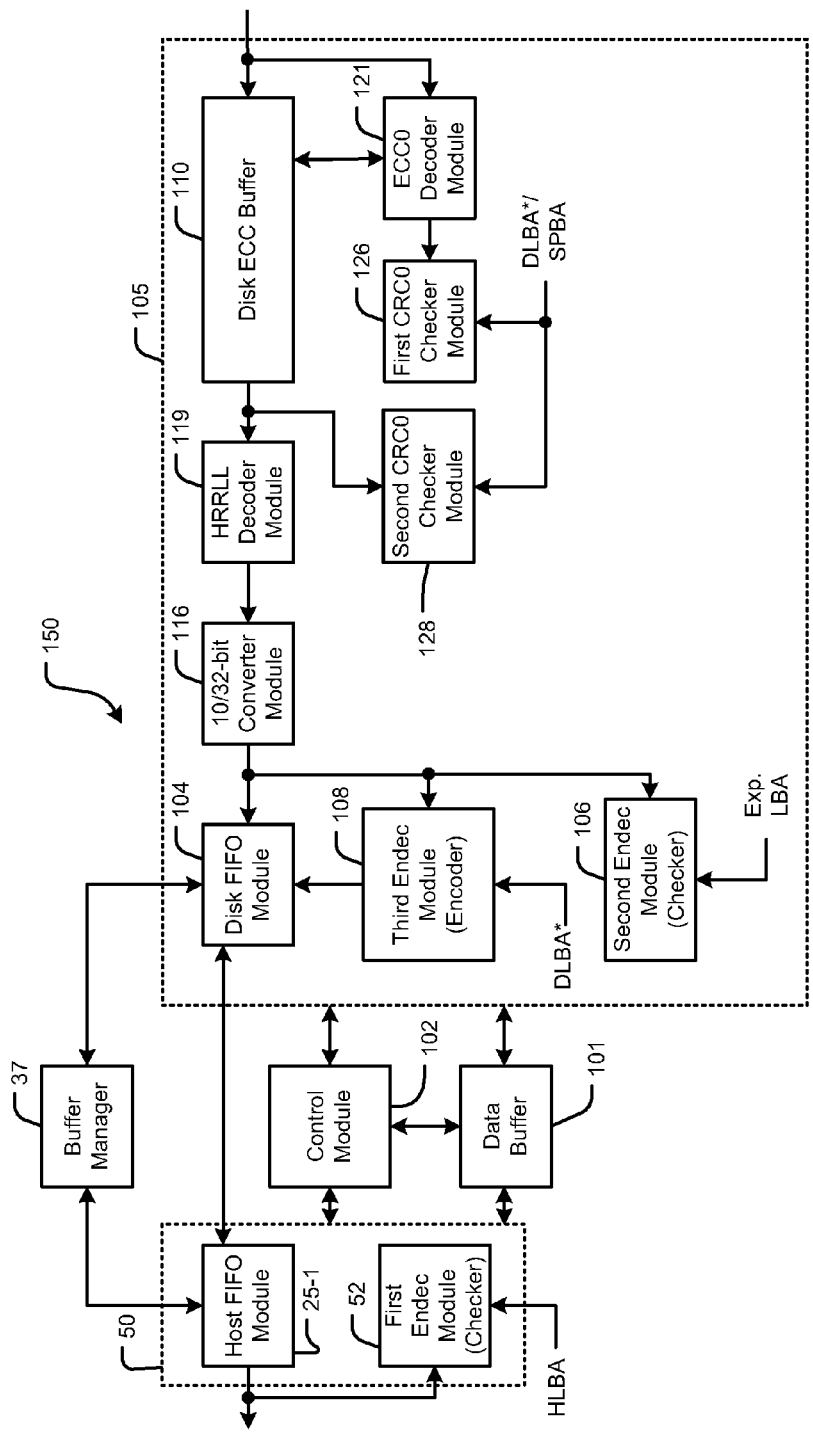
FIG. 4B is a functional block diagram of an exemplary read data-path in a disk drive according to the present disclosure.

Referring now to FIG. 4B, a system 150 for protecting read data-path in a disk drive comprises a host-bus interface (hereinafter "interface") module 50, a buffer manager 37, a control module 102, a data buffer 101, and a HDC module 105. The interface module 50 may include an input/output (I/O) interface such as ATA, SATA, etc. The disk drive may communicate with a host device (not shown) such as a processor via the interface module 50.

The interface module 50 may receive a request from the host device to read from the disk drive a block having a host logical block address (HLBA) (i.e., a requested LBA). The HDC module 105 receives the block from a read-channel module (not shown), processes the block, and stores the block in a disk FIFO (first-in first-out) module 104 in the HDC module 105.

The control module 102 determines if an error occurred in the block during processing. If the control module 102 determines that no error occurred in the block, the block is output to a host FIFO module 25-1 in the interface module 50. The buffer manager 37 manages buffering of data in the disk FIFO module 104 and the host FIFO module 25-1. The interface module 25 outputs the block to the host device.

The interface module 50 comprises the host FIFO module 25-1 and a first encoder/decoder (endec) module 52. The HDC module 105 comprises a ECC0 decoder module 121, a first CRC0 checker module 126, a second CRC0 checker module 128, and a disk ECC buffer 110. Additionally, the HDC module 105 comprises a HRRLL decoder module 119, a 10/32-bit converter module 116, a second endec module 106, a third endec module 108, and a disk FIFO module 104.

The first and second CRC0 checker modules 126, 128 use a CRC0 code to encode data. The first and second endec modules 52, 106 function as checkers and use a CRC1 code to encode data. The third endec module 108 functions as an encoder and uses the CRC1 code to encode data.

The ECC0 decoder module 121 decodes the block received from the read-channel module and stores the decoded block in the disk ECC buffer 110. The first CRC0 checker module 126 determines if an error occurred in the block because a wrong sector is read from the media. Such an error is called a sector physical block address (SPBA) error. The first CRC0 checker module 126 is seeded with SPBA or DLBA*, where DLBA* is calculated by the control module 102 as described in the system 100.

Specifically, the first CRC0 checker module 126 computes a CRC0 checksum of the data in the block using the seed information and compares the computed checksum to a CRC0 checksum embedded in the block received from the read-channel module. If the computed and embedded checksums match, the first CRC0 checker module 126 determines that no error occurred in the block. Otherwise, the first CRC0 checker module 126 generates a control signal to indicate that an error occurred in the block received from the read-channel module. The control module 102 receives the control signal.

The second CRC0 checker module 128, which is seeded with SPBA or DLBA*, determines if an error occurred in the block in the disk ECC buffer 110. Specifically, the second CRC0 checker module 128 computes a CRC0 checksum of the data in the block stored in the disk ECC buffer 110 using the seed information and compares the computed checksum to a CRC0 checksum embedded in the block stored in the disk ECC buffer 110.

If the computed and embedded checksums match, the second CRC0 checker module 128 determines that no error occurred in the block in the disk ECC buffer 110. Otherwise, the second CRC0 checker module 128 generates a control signal to indicate that an error occurred in the block in the disk ECC buffer 110. The control module 102 receives the control signal. Thus, the second CRC0 checker module 128 protects the disk ECC buffer 110.

The HRRLL decoder module 119 receives the block from the disk ECC buffer 110 and decodes the block using HRRLL decoding. The 10/32-bit converter module 116 converts the block received from the HRRLL encoder module 119 from a 10-bit domain to a 32-bit domain and outputs the block to the disk FIFO module 104.

During a read operation, the block that is read includes data and optionally a CRC1 checksum that has an embedded LBA. The embedded LBA in the CRC1 checksum may or may not be equal to an expected LBA, which may be the requested LBA or escape LBA. The second endec module 106 determines whether the embedded LBA is equal to the expected LBA.

Since the LBA is embedded in the CRC1 checksum and is not separately stored in the block, the second endec module 106 appends the requested LBA to the block received from the 10/32-bit converter module 116 and stores the appended block in the data buffer 101. The requested LBA is appended between data and CRC1 checksum in the block in the same manner in which HLBA is appended to the block during a write operation.

The second endec module 106 functions as a checker and is seeded with the expected LBA. The second endec module 106 computes a CRC1 checksum of the data in the appended block by performing remainder calculations using the expected LBA. The second endec module 106 compares the computed CRC1 checksum with the CRC1 checksum that is embedded in the block stored in the data buffer 101. If the two checksums match, the second endec module 106 determines that the read block has the expected LBA and no errors occurred in the block. Otherwise, the endec module 106 generates a control signal indicating that an error occurred. The control module 102 receives the control signal.

When host block-size is different from disk block-size, the control module 102 enables the third endec module 108. The third endec module 108 is seeded with DLBA*, which is calculated by the control module 102 in the same manner as explained in the system 100. The third endec module 108 computes a CRC1 checksum of the data in the block using the seed information, encodes the block, and outputs the encoded block to the disk FIFO module 104.

The disk FIFO module 104 outputs the block to the host FIFO module 25-1 in the interface module 50. Additionally, the control module 102 stores the block output by the disk FIFO module 104 in the data buffer 101. The first endec module 52 in the interface module 50 is seeded with HLBA and functions as a checker instead of an encoder. The first endec module 52 computes a CRC1 checksum of the data in the block stored in the host FIFO module 25-1 using the HLBA and compares the computed checksum to the CRC1 checksum in the block stored in the data buffer 101.

If the two checksums match, the first endec module 52 determines that no error occurred in the block stored in the host FIFO module 25-1. That is, the block received by the host FIFO module 25-1 is the same as the block output by the disk FIFO module 104. In other words, the first endec module 52 protects the disk FIFO module 104, the data buffer 101, and the host FIFO module 25-1.

Figure 5A:
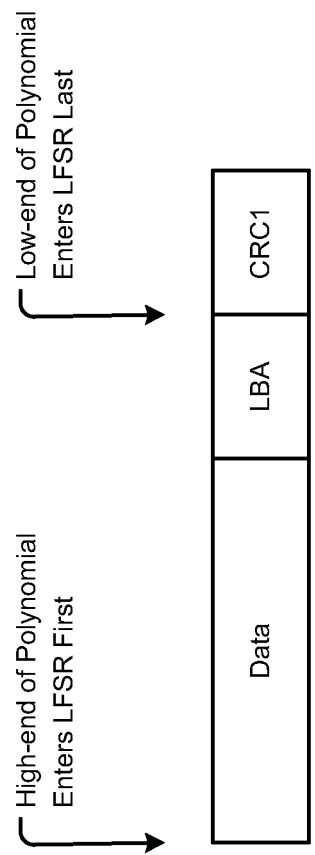
FIG. 5A shows a sequence in which information is stored in a block in a data buffer and the sequence in which the information is input to a linear feedback shift register (LFSR) of an encoder module according to the present disclosure.
Figure 5B:
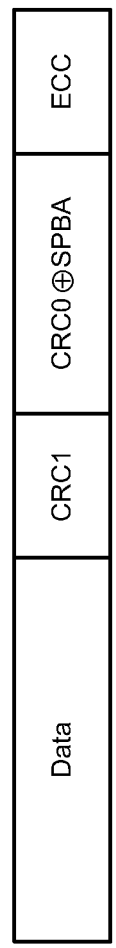
FIG. 5B shows a sequence in which information is stored in a block on the platters of a disk drive according to the present disclosure.

Referring now to FIGS. 5A-5F, the second endec module 106 computes remainders when checking LBA information as follows. The second endec module 106 includes a linear feedback shift register (LFSR). The block (with appended LBA) stored in the data buffer 101 is represented by a polynomial. The high-end of the polynomial is input to the LFSR first, followed by the low-end of the polynomial. Specifically, the data in the block is input to the LFSR first, followed by the LBA as shown in FIG. 5A. The LBA is appended to the data block stored in the data buffer 101 as shown. When the block is written in the disk, data and the CRC1 checksum is followed by an XOR of a CRC0 checksum and SPBA, and the ECC is appended at the end of the block as shown in FIG. 5B.

Seeding LBA as shown in FIG. 5A and loading high-end followed by low-end of the polynomials into the LFSR simplifies comparing LBA information as follows. During a read operation in the disk drive, a block that is read may include data and a CRC1 checksum. The CRC1 checksum may include either DLBA* or escape LBA (e.g., a 32-bit hexadecimal number such as FFFFFFFF) as shown in FIG. 5C. If the second endec module 106 finds either DLBA* or escape LBA embedded in the CRC1 checksum of the block, the second endec module 106 determines that the block read is the correct block.

The second endec module 106 may compare the LBA information by splitting the block into two portions: a first portion including only data in the block and a second portion including the rest of the information such as LBA and CRC1 checksum of the block. The second endec module 106 may compare the LBA information in following steps.

In step 1, the second endec module 106 may compute a first remainder R1 using only the first portion as shown in FIG. 5D. Mathematically, this may be expressed as $R1=Rem(d(x) \times 64, g(x))$, where $g(x)$ is a generator polynomial for the CRC1 code and $d(x)$ is the polynomial that has a degree $deg(d(x))$ and that represents the first portion.

A second remainder $R2=Rem(f(x) \times 32, g(x))$ for the predetermined escape LBA may be pre-computed as shown in FIG. 5E, where $f(x)$ is a polynomial that represents the escape LBA. The pre-computed remainder R2 may be stored in the second endec module 106 when the disk drive is initialized. Thus, additional clock cycles are not required to calculate R2 when the second endec module 106 compares LBA information. If the LBA embedded in CRC1 checksum of the block is escape LBA, then the sum (R1+R2) will be equal to CRC1 checksum of the block. Thus, in step 2, the second endec module 106 may determine that the block read is a correct block if (R1+R2)=CRC1 checksum since the LBA embedded in the CRC1 checksum matches the escape LBA.

Alternatively, in step 3, the second endec module 106 may calculate a third remainder $R3=Rem(1(x) \times 32, g(x))$ for the LBA information seeded in the block as shown in FIG. 5F, where $1(x)$ is a polynomial that has a degree $deg(1(x))$ and that represents the seeded LBA information in the block. If the LBA embedded in CRC1 checksum of the block matches the requested LBA, then the sum (R1+R3) will be equal to CRC1 checksum of the block. Thus, in step 3, the second endec module 106 may determine that the block read is the requested block if (R1+R3)=CRC1 checksum since the LBA embedded in the CRC1 checksum matches the requested LBA.

Computing R1 only once in determining whether the LBA embedded in the CRC1 checksum matches the escape LBA or the requested LBA saves power and time. Additionally, seeding the LBA at the low-end of the polynomial as shown in FIG. 5A enables efficient checking of CRC1 checksum regardless of the length of the block. Specifically, the second endec module 106 may calculate R1 only once regardless of the length of the block, and step 2 is unchanged by the length of the block.

The CRC1 code may be generated using a polynomial $g(x)=(1+x)$, where $p(x)=x31+x23+x15+x14+x7+x4+x3+1$. Additionally, the host and disk FIFO modules 25-1, 104 use a dual-bit parity code that may use a generator polynomial given by $g(x)=1+x2$. That is, the host and disk FIFO modules 25-1, 104 may use two parity bits for each 32 bits of data.

Figure 6A:
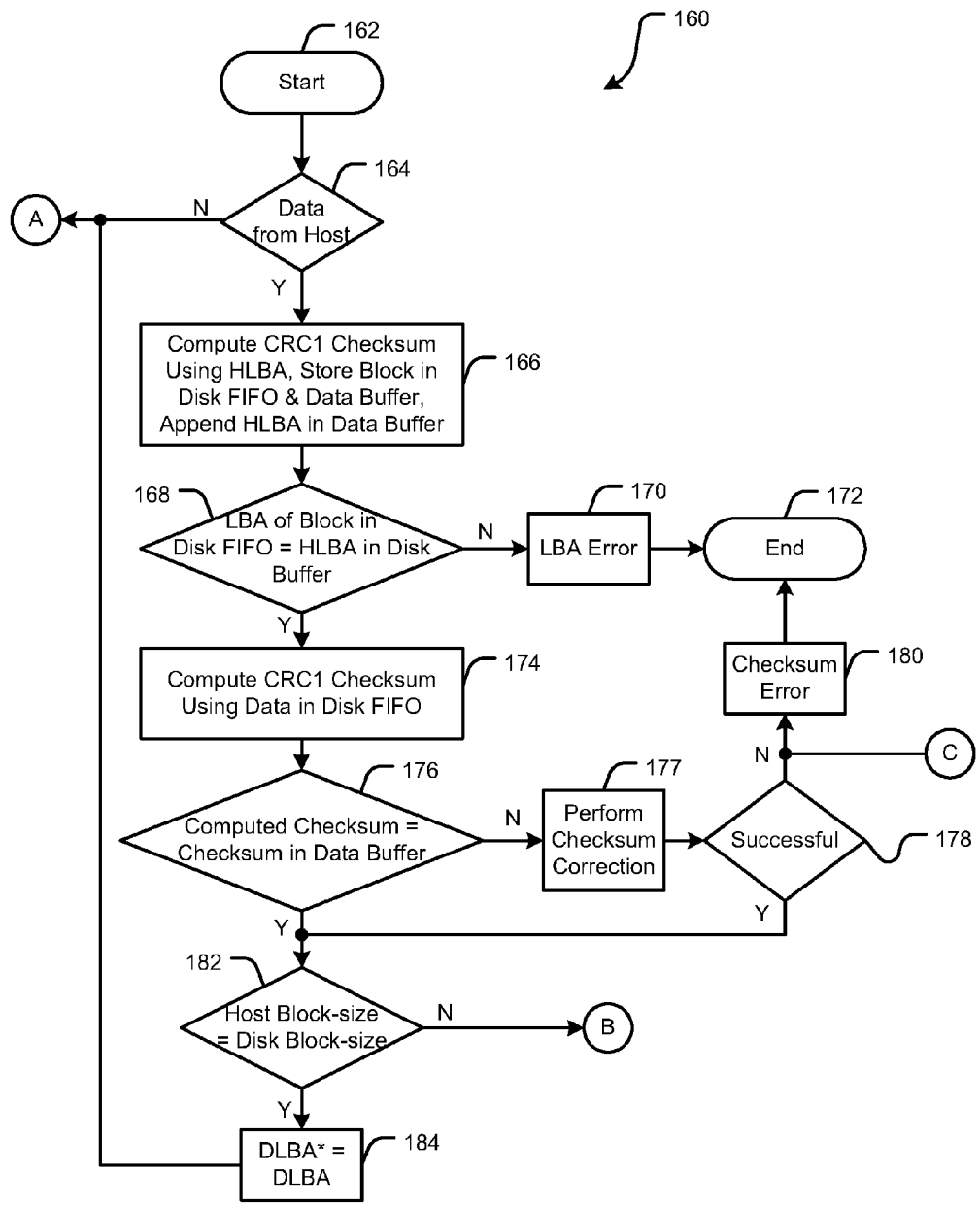
FIGS. 6A-6B are flowcharts of a method for protecting a write data path in a disk drive according to the present disclosure.
Figure 6B:
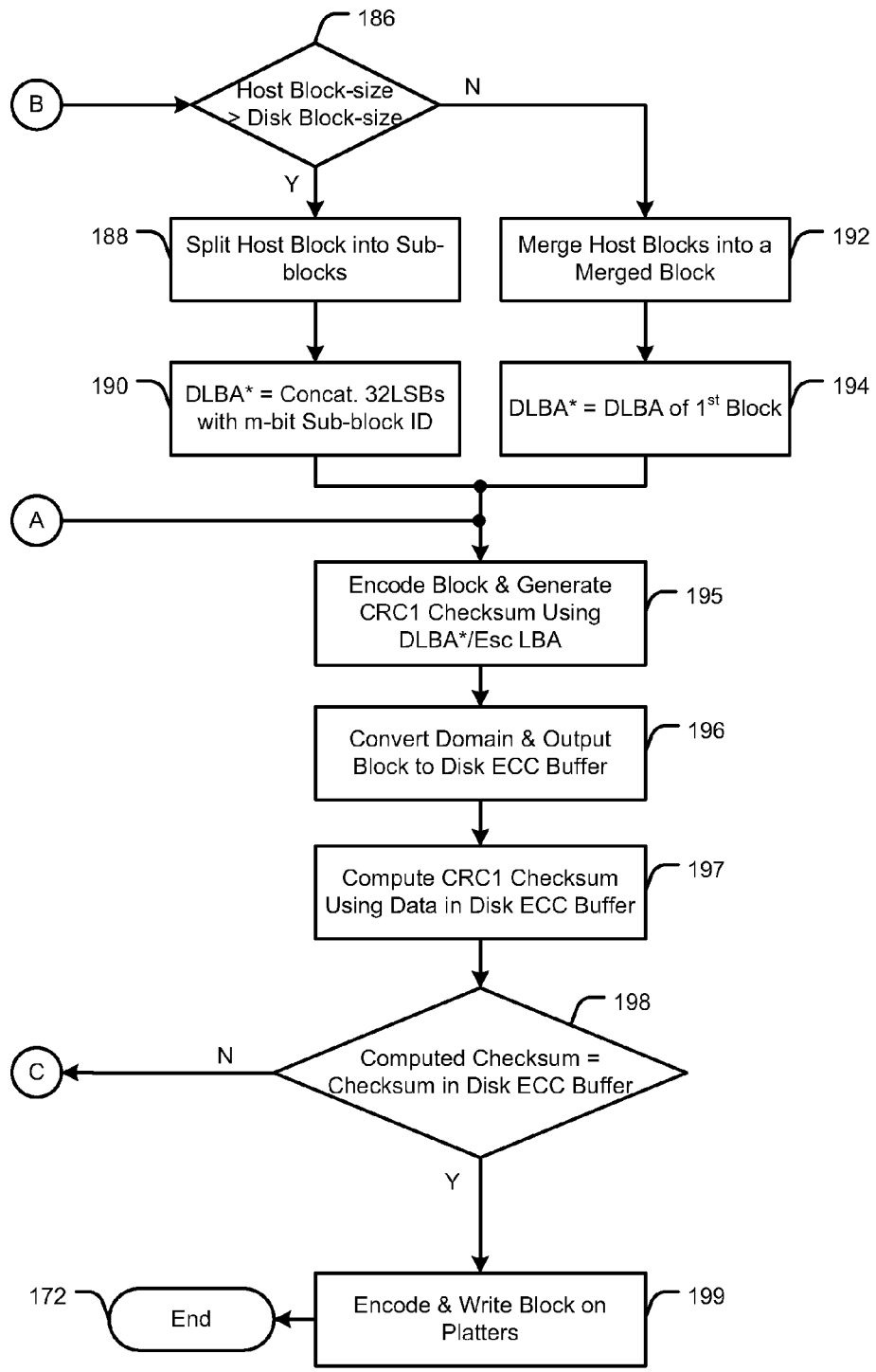

Referring now to FIGS. 6A-6B, a method 160 for protecting write data-path in a disk drive begins at step 162. In step 164, a control module 102 determines the source of data—whether a block of data to be written is received from a host device or is provided internally by the disk drive.

When the block is received from the host device, a first endec module 52 computes a CRC1 checksum of the block based on data and a host LBA of the block, and the control module 102 stores the block with the CRC1 checksum in a disk FIFO module 104 and the block with HLBA appended in a data buffer 101 in step 166.

A second endec module 106 determines in step 168 if the LBA information in the block that is stored in the disk FIFO module 104 matches the host LBA (HLBA) stored in the data buffer 101. If false, the second endec module 106 generates a control signal in step 170 to indicate that an LBA error occurred and communicates the control signal to the control module 102. In that case, the method 160 ends in step 172.

Otherwise, in step 174, the second endec module 106 computes a CRC1 checksum for the block based on the data in the block received by the disk FIFO module 104. In step 176, the second endec module 106 compares the computed CRC1 checksum with the CRC1 checksum embedded in the block stored in the data buffer 101.

If the computed and embedded checksums do not match, the second endec module 106 determines in step 170 that a random error occurred when the block was received by the disk FIFO module 104. The control module 102 attempts to correct the checksum in step 177 and determines in step 178 if the checksum correction succeeded or failed. If the checksum correction failed, the control module 102 generates a control signal in step 180 to indicate that the random error is not correctable, and the method 160 ends in step 172.

If the checksum correction succeeded, the control module 102 determines in step 182 if the host block-size matches the disk block-size. If the host block-size matches the disk block-size, the control module 102 determines in step 184 that DLBA*=DLBA. Otherwise, the control module 102 determines in step 186 if the host block-size is greater than the disk block-size.

If the host block-size is greater than the disk block-size, the control module 102 splits the host block into sub-blocks in step 188. The control module 102 computes a DLBA* by concatenating (32−m) least significant bits (LSBs) of the DLBA with an m-bit sub-block ID in step 190, where the m-bit sub-block ID is used to identify the sub-blocks.

If, however, the host block-size is less than disk block-size, the control module 102 merges host blocks into a merged block in step 192. The control module 102 uses the DLBA of the first block in the merged block as DLBA* in step 194.

In step 195, a third endec module 108 uses DLBA* generated in steps 184, 190, or 194 if the data is received from the host device, or uses an escape LBA if data is not received from the host device, to encode the data in the block stored in the disk FIFO module 104 and generates a CRC1 checksum for the block. The encoded block is converted from the 32-bit domain to the 10-bit domain and output to the disk ECC buffer 110 in step 196.

A fourth endec module 112 computes a CRC1 checksum of the data in the data block stored in the disk ECC buffer 110 using the DLBA* in step 197. In step 198, the fourth endec module 112 determines if the computed CRC1 checksum matches the CRC1 checksum of the data block stored in the disk ECC buffer 110. If false, in step 180, the fourth endec module 112 generates a control signal that indicates an error occurred when the block was received by the disk ECC buffer 110. Otherwise, the block is encoded using HRRLL code, etc., and is written on the platters in step 199. The method 160 ends in step 172.

Figure 6C:
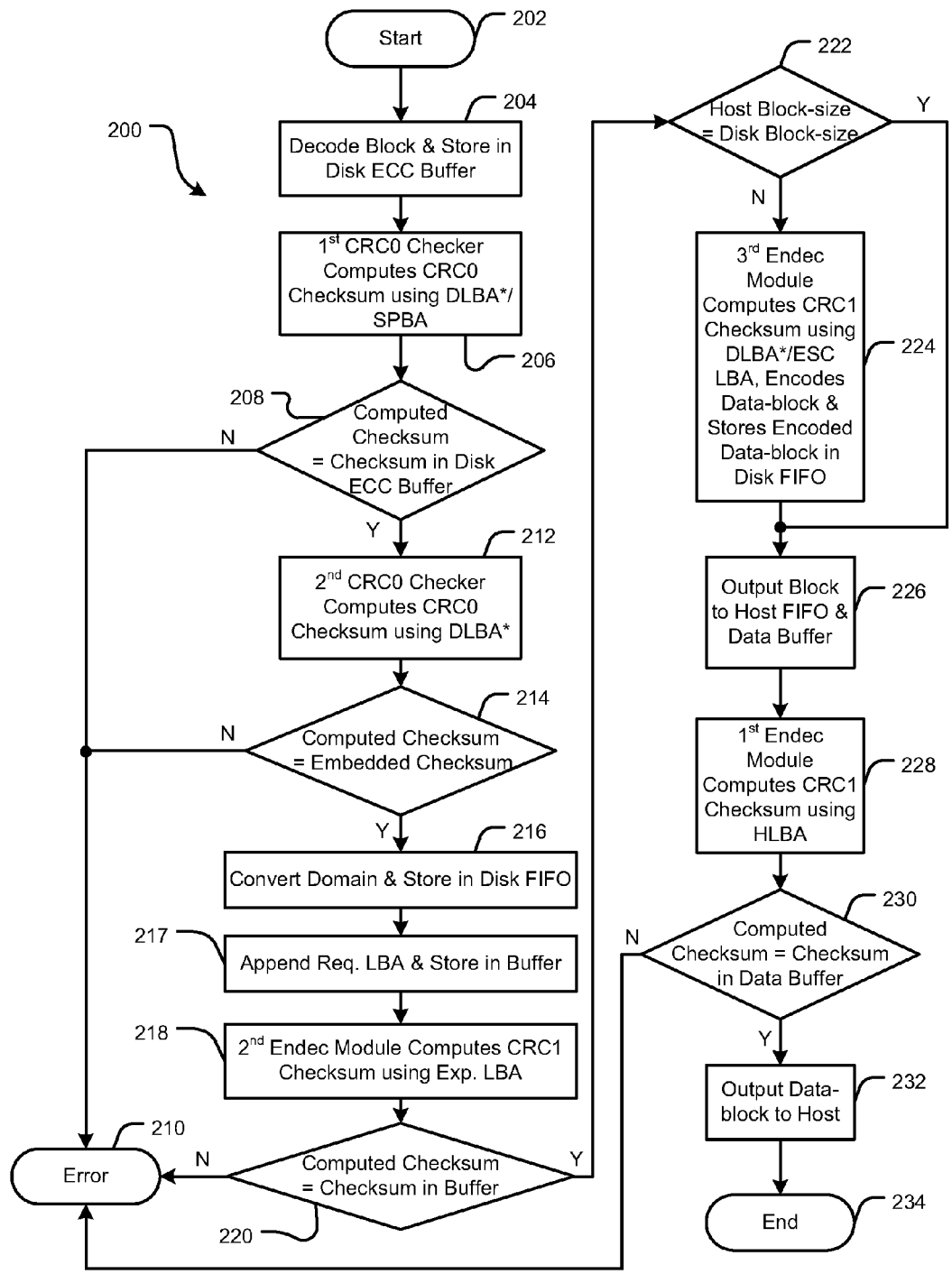
FIG. 6C is a flowchart of a method for protecting a read data path in a disk drive according to the present disclosure.

Referring now to FIG. 6C, a method 200 for protecting read data-path in a disk drive begins at step 202. An ECC0 decoder module 121 decodes a block read from platters and stores the decoded block in a disk ECC buffer 110 in step 204. In step 206, a first CRC0 checker module 126, which is seeded with DLBA* or SPBA, computes a CRC0 checksum of the data in the block received from platters. The first CRC0 checker module 126 determines in step 208 if the computed checksum is equal to the checksum in the block received from platters. If false, the first CRC0 checker module 126 generates a control signal and indicates in step 210 that an error occurred.

If true, in step 212, a second CRC0 checker module 128, which is seeded with DLBA* or SPBA, computes a CRC0 checksum of the data in the block stored in the disk ECC buffer 110. The second CRC0 checker module 128 determines in step 214 if the computed checksum is equal to the checksum in the block stored in the disk ECC buffer 110. If false, the second CRC0 checker module 128 generates a control signal and indicates in step 210 that an error occurred.

If true, in step 216, a HRRLL decoder module 119 decodes the block and a 10/32-bit converter module 116 converts the block from a 10-bit domain to a 32-bit domain and stores the block in a disk FIFO module 104. A second endec module 106, which is seeded with an expected LBA (i.e., a requested or escape LBA), appends a requested LBA to the block and stores the appended block in a data buffer 101 in step 217.

The second endec module 106 computes a CRC1 checksum of the data in the appended block in step 218. The second endec module 106 determines if the computed checksum is equal to the checksum in the block in step 220. If false, the second endec module 106 generates a control signal and indicates in step 210 that an error occurred due to LBA mismatch (i.e., the block read has an incorrect LBA).

Otherwise, the control module 102 determines if the host block-size is equal to the disk block-size in step 222. If false, in step 224, a third endec module 108, which is seeded with DLBA*, computes a CRC1 checksum of the data in the block, encodes the block, and stores the encoded block in the disk FIFO module 104. The disk FIFO module 104 outputs the block to a host FIFO module 25-1 and a data buffer 101 in step 226.

In step 228, a first endec module 52, which is seeded with HLBA, computes a CRC1 checksum of the data stored in the host FIFO module 25-1. In step 230, the first endec module 52 determines if the computed checksum matches the checksum stored in the data buffer 101. If false, the first endec module 52 generates a control signal and indicates in step 210 that an error occurred in the block received by the host FIFO module 25-1. Otherwise, the block is output by the host FIFO-module 25-1 to a host device in step 232, and the method 200 ends in step 234.

Figure 7:
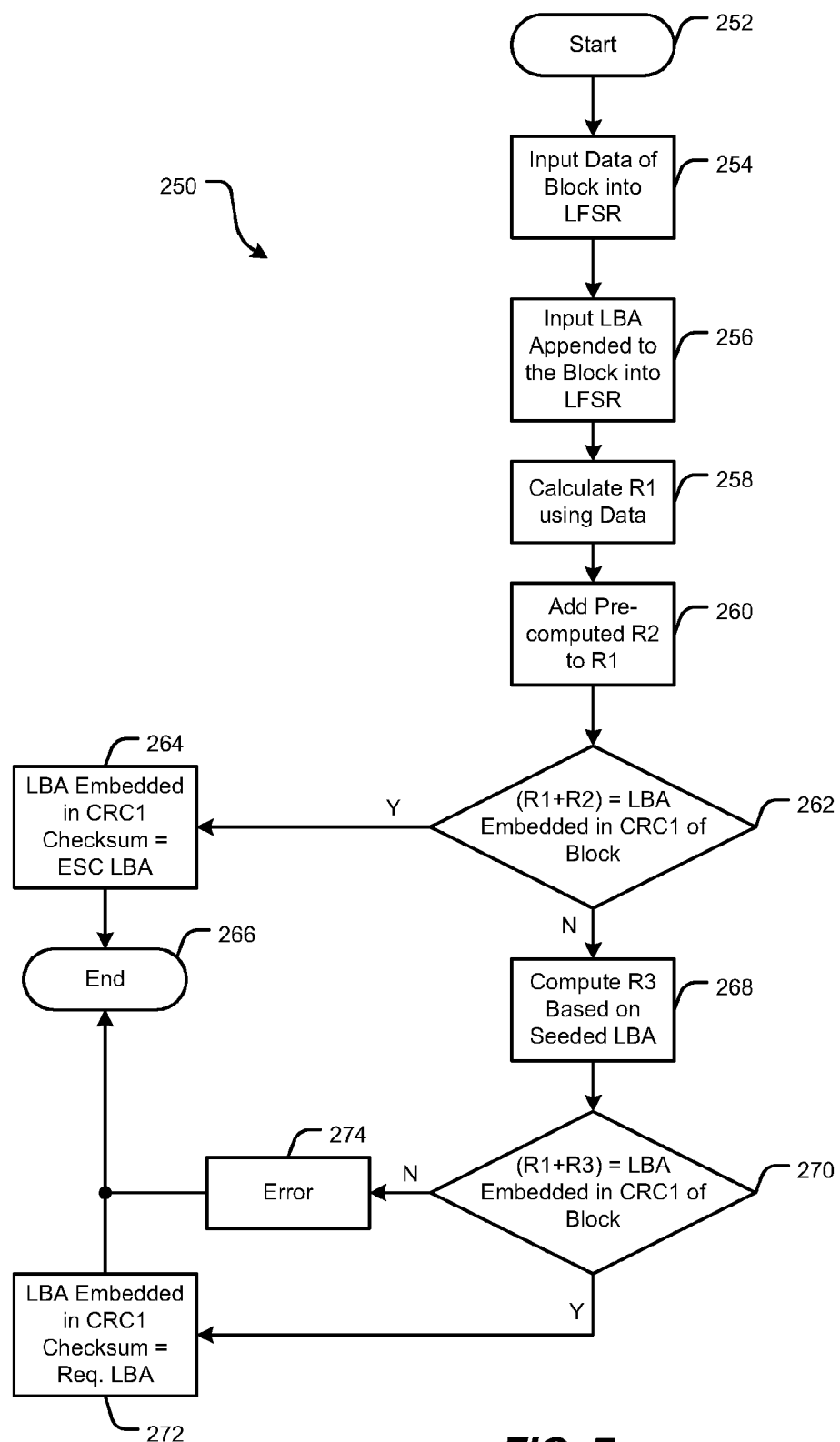
FIG. 7 is a flowchart of a method for seeding a logical block address (LBA) in a block and computing remainders when checking LBA according to the present disclosure.

Referring now to FIG. 7, a method 250 for seeding a logical block address (LBA) in a block and computing a remainder begins at step 252. A second endec module 106 first inputs data of a block into a linear feedback shift register (LFSR) in step 254. The second endec module 106 inputs an LBA of the block into the LFSR following the data in step 256.

The second endec module 106 computes a first remainder R1 using only the data in the block in step 258. The second endec module 106 adds a pre-computed remainder R2 (computed based on a predetermined escape LBA) to the remainder R1 in step 260. The second endec module 106 determines if the sum (R1+R2) matches the LBA embedded in the CRC1 checksum of the data block in step 262. If true, the second endec module 106 determines in step 264 that the LBA embedded in the CRC1 checksum of the block matches the escape LBA, and the method 250 ends in step 266.

Otherwise, in step 268, the second endec module 106 computes a third remainder R3 based on the LBA information that is seeded in the block. The second endec module 106 determines if the sum (R1+R3) matches the LBA embedded in the CRC1 checksum of the data block in step 270. If true, the second endec module 106 determines in step 272 that the LBA embedded in the CRC1 checksum of the block matches the requested LBA, and the method 250 ends in step 266. If false, the second endec module 106 generates a control signal and indicates in step 274 and that an error occurred, and the method 250 ends in step 266.

Figure 8B:
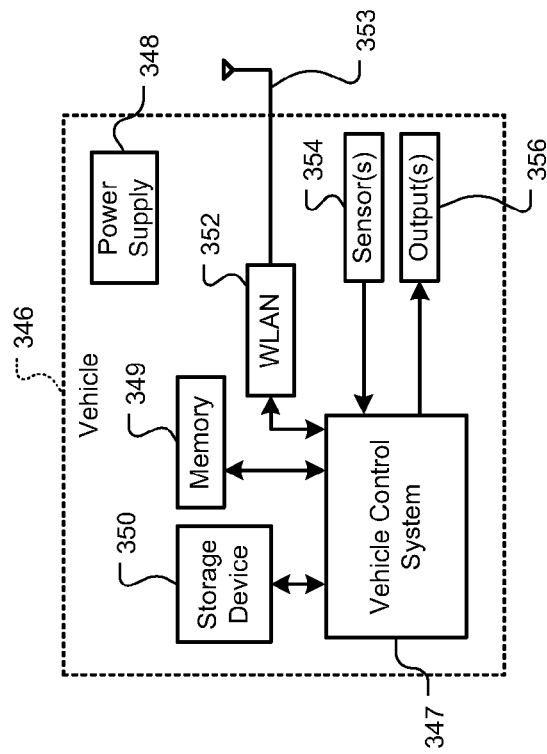
FIG. 8B is a functional block diagram of a vehicle control system.
Figure 8A:
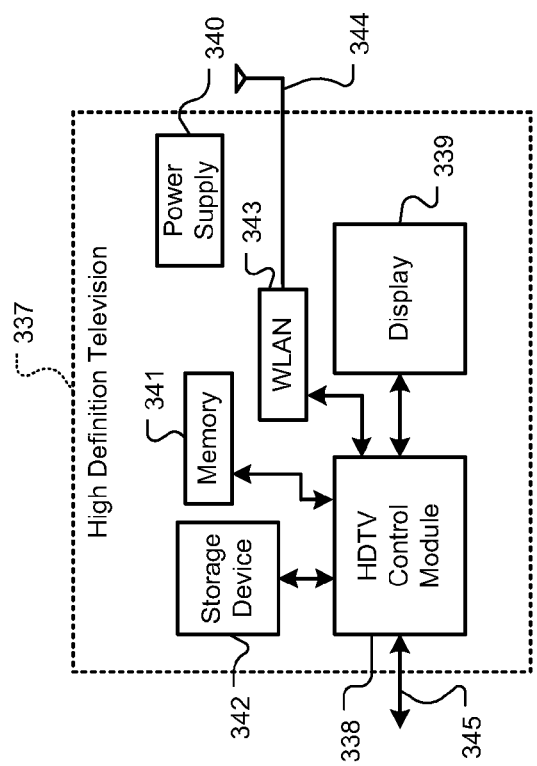
FIG. 8A is a functional block diagram of a high definition television.

Referring now to FIGS. 8A-8E, various exemplary implementations incorporating the teachings of the present disclosure are shown. Referring now to FIG. 8A, the teachings of the disclosure can be implemented in a storage device 342 of a high definition television (HDTV) 337. The HDTV 337 includes a HDTV control module 338, a display 339, a power supply 340, memory 341, the storage device 342, a WLAN interface 343 and associated antenna 344, and an external interface 345.

The HDTV 337 can receive input signals from the WLAN interface 343 and/or the external interface 345, which sends and receives information via cable, broadband Internet, and/or satellite. The HDTV control module 338 may process the input signals, including encoding, decoding, filtering, and/or formatting, and generate output signals. The output signals may be communicated to one or more of the display 339, memory 341, the storage device 342, the WLAN interface 343, and the external interface 345.

Memory 341 may include random access memory (RAM) and/or nonvolatile memory such as flash memory, phase change memory, or multi-state memory, in which each memory cell has more than two states. The storage device 342 may include an optical storage drive, such as a DVD drive, and/or a hard disk drive (HDD). The HDTV control module 338 communicates externally via the WLAN interface 343 and/or the external interface 345. The power supply 340 provides power to the components of the HDTV 337.

Referring now to FIG. 8B, the teachings of the disclosure may be implemented in a storage device 350 of a vehicle 346. The vehicle 346 may include a vehicle control system 347, a power supply 348, memory 349, the storage device 350, and a WLAN interface 352 and associated antenna 353. The vehicle control system 347 may be a powertrain control system, a body control system, an entertainment control system, an anti-lock braking system (ABS), a navigation system, a telematics system, a lane departure system, an adaptive cruise control system, etc.

The vehicle control system 347 may communicate with one or more sensors 354 and generate one or more output signals 356. The sensors 354 may include temperature sensors, acceleration sensors, pressure sensors, rotational sensors, airflow sensors, etc. The output signals 356 may control engine operating parameters, transmission operating parameters, suspension parameters, etc.

The power supply 348 provides power to the components of the vehicle 346. The vehicle control system 347 may store data in memory 349 and/or the storage device 350. Memory 349 may include random access memory (RAM) and/or nonvolatile memory such as flash memory, phase change memory, or multi-state memory, in which each memory cell has more than two states. The storage device 350 may include an optical storage drive, such as a DVD drive, and/or a hard disk drive (HDD). The vehicle control system 347 may communicate externally using the WLAN interface 352.

Figure 8D:
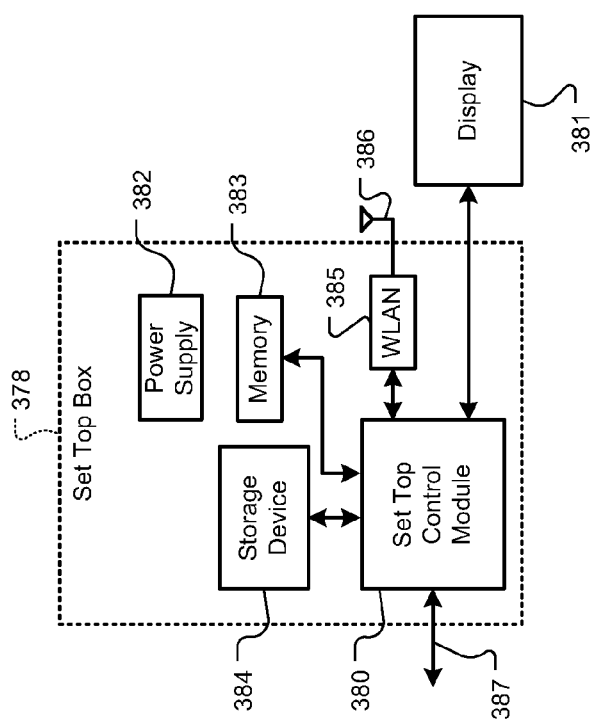
FIG. 8D is a functional block diagram of a set top box.
Figure 8C:
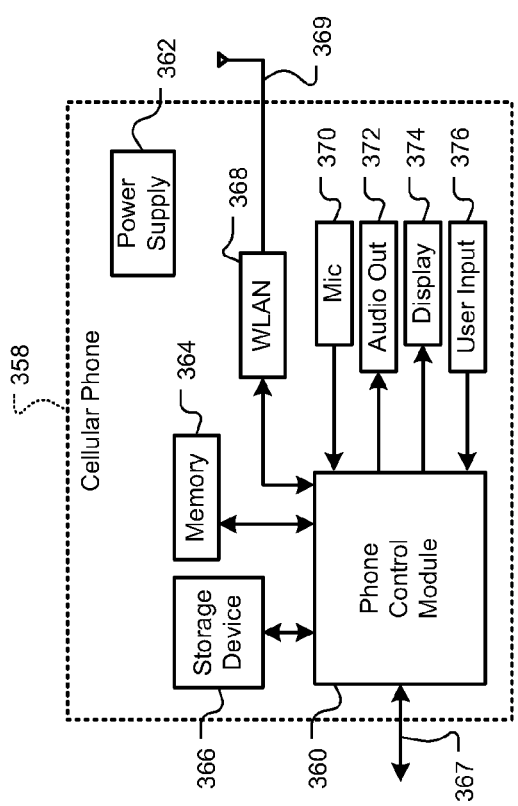
FIG. 8C is a functional block diagram of a cellular phone.

Referring now to FIG. 8C, the teachings of the disclosure can be implemented in a storage device 366 of a cellular phone 358. The cellular phone 358 includes a phone control module 360, a power supply 362, memory 364, the storage device 366, and a cellular network interface 367. The cellular phone 358 may include a WLAN interface 368 and associated antenna 369, a microphone 370, an audio output 372 such as a speaker and/or output jack, a display 374, and a user input device 376 such as a keypad and/or pointing device.

The phone control module 360 may receive input signals from the cellular network interface 367, the WLAN interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the WLAN interface 368, and the audio output 372.

Memory 364 may include random access memory (RAM) and/or nonvolatile memory such as flash memory, phase change memory, or multi-state memory, in which each memory cell has more than two states. The storage device 366 may include an optical storage drive, such as a DVD drive, and/or a hard disk drive (HDD). The power supply 362 provides power to the components of the cellular phone 358.

Referring now to FIG. 8D, the teachings of the disclosure can be implemented in a storage device 384 of a set top box 378. The set top box 378 includes a set top control module 380, a display 381, a power supply 382, memory 383, the storage device 384, and a WLAN interface 385 and associated antenna 386.

The set top control module 380 may receive input signals from the WLAN interface 385 and an external interface 387, which can send and receive information via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the WLAN interface 385 and/or to the display 381. The display 381 may include a television, a projector, and/or a monitor.

The power supply 382 provides power to the components of the set top box 378. Memory 383 may include random access memory (RAM) and/or nonvolatile memory such as flash memory, phase change memory, or multi-state memory, in which each memory cell has more than two states. The storage device 384 may include an optical storage drive, such as a DVD drive, and/or a hard disk drive (HDD).

Figure 8E:
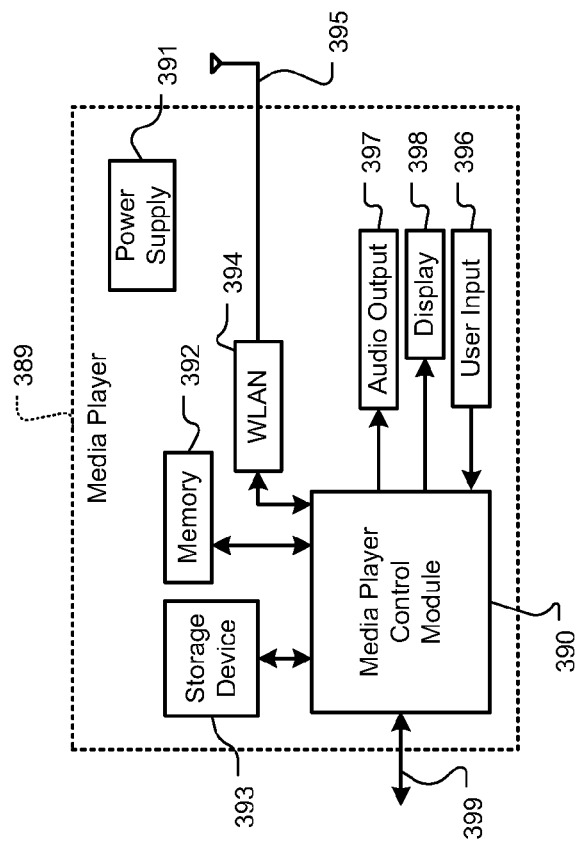
FIG. 8E is a functional block diagram of a media player.

Referring now to FIG. 8E, the teachings of the disclosure can be implemented in a storage device 393 of a media player 389. The media player 389 may include a media player control module 390, a power supply 391, memory 392, the storage device 393, a WLAN interface 394 and associated antenna 395, and an external interface 399.

The media player control module 390 may receive input signals from the WLAN interface 394 and/or the external interface 399. The external interface 399 may include USB, infrared, and/or Ethernet. The input signals may include compressed audio and/or video, and may be compliant with the MP3 format. Additionally, the media player control module 390 may receive input from a user input 396 such as a keypad, touchpad, or individual buttons. The media player control module 390 may process input signals, including encoding, decoding, filtering, and/or formatting, and generate output signals.

The media player control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the media player 389. Memory 392 may include random access memory (RAM) and/or nonvolatile memory such as flash memory, phase change memory, or multi-state memory, in which each memory cell has more than two states. The storage device 393 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system, comprising:
a first buffer module configured to receive, from a host, (i) a first block and (ii) a first logical block address corresponding to the first block, wherein the first block includes first data;
a first encoder module configured to generate a first checksum based on (i) the first data and (ii) the first logical block address;
a control module configured to generate a second block, wherein the second block includes (i) the first data, (ii) the first logical block address, and (iii) the first checksum; and
a second buffer module configured to
receive a third block from the first buffer module, wherein the third block includes a second logical block address, and
determine whether the third block is different than the first block depending on whether the second logical block address included in the third block is different than the first logical block address included in the second block.

2. The system of claim 1, wherein the third block includes second data, and the system further comprises:
a second encoder module configured to
generate a second checksum based on (i) the second data and (ii) the second logical block address, and
determine whether the second data in the third block received by the second buffer module is different than the first data in the first block received by the first buffer module depending on whether the second checksum is different than the first checksum included in the second block.

3. The system of claim 2, wherein the control module is configured to correct an error in the second checksum, and generate a corrected checksum if the second checksum is different than the first checksum included in the second block.

4. The system of claim 3, wherein the control module is configured to determine whether the third block received by the second buffer module is different than the first block received by the first buffer module depending on whether the second checksum or the corrected checksum is different than the first checksum included in the second block.

5. The system of claim 2, further comprising a third encoder module configured to:
generate a third checksum based on (i) the second data in the third block received by the second buffer module and (ii) a predetermined logical block address, and
generate a fourth block including (i) the second data and (ii) the third checksum.

6. The system of claim 5, wherein the control module is configured to:
generate a fifth block by merging a plurality of blocks received by the second buffer module when a block size of the first block received by the first buffer module is less than a predetermined size, and
generate the predetermined logical block address based on a third logical block address of one of the blocks in the fifth block.

7. The system of claim 5, wherein the control module is configured to:
generate a plurality of blocks by splitting the third block received by the second buffer module when a block size of the first block received by the first buffer module is greater than a predetermined size,
identify the blocks using identifiers having a predetermined number of bits, and
generate the predetermined logical block address by concatenating a plurality of least significant bits of a third logical block address with the bits of the identifiers.

8. The system of claim 5, further comprising:
a first converter module configured to convert (i) the third block or (ii) the fourth block into a fifth block, wherein the fifth block has a different data format than (i) the third block or (ii) the fourth block,
a third buffer module configured to store the fifth block received from the converter module; and
a second converter module configured to convert the fifth block received by the third buffer module into a sixth block, wherein the sixth block has data format of (i) the third block or (ii) the fourth block.

9. The system of claim 8, wherein the sixth block includes third data, the system further comprising a fourth encoder module configured to:
generate a fourth checksum based on (i) the third data and (ii) the predetermined logical block address, and
determine whether the fifth block received by the third buffer module is different than the third block received by the second buffer module depending on whether the fourth checksum is different than the third checksum.

10. The system of claim 9, wherein the fifth block includes fourth data, the system further comprising:
a fifth encoder module configured to generate a fifth checksum based on (i) the fourth data and (ii) the predetermined logical block address or a physical block address and to generate a seventh block, wherein the seventh block includes (i) the fourth data and (ii) the fifth checksum;
a sixth encoder module configured to generate an eighth block by encoding the seventh block using an error-correcting code; and
a writing module configured to write the eighth block on a storage medium of a data storage device.

11. A method, comprising:
receiving, at a first buffer module, (i) a first block and (ii) a first logical block address corresponding to the first block, wherein the first block includes first data;
generating a first checksum based on (i) the first data and (ii) the first logical block address;
generating a second block, wherein the second block includes (i) the first data, (ii) the first logical block address, and (iii) the first checksum;
receiving, at a second buffer module, a third block from the first buffer module, wherein the third block includes a second logical block address; and
determining whether the third block is different than the first block depending on whether the second logical block address included in the third block is different than the first logical block address included in the second block.

12. The method of claim 11, wherein the third block includes second data, the method further comprising:
generating a second checksum based on (i) the second data and (ii) the second logical block address; and
determining whether the second data in the third block received by the second buffer module is different than the first data in the first block received by the first buffer module depending on whether the second checksum is different than the first checksum included in the second block.

13. The method of claim 12, further comprising correcting an error in the second checksum and generating a corrected checksum if the second checksum is different than the first checksum included in the second block.

14. The method of claim 13, further comprising determining whether the third block received by the second buffer module is different than the first block received by the first buffer module depending on whether the second checksum or the corrected checksum is different than the first checksum included in the second block.

15. The method of claim 12, further comprising:
generating a third checksum based on (i) the second data in the third block received by the second buffer module and (ii) a predetermined logical block address; and
generating a fourth block including (i) the second data and (ii) the third checksum.

16. The method of claim 15, further comprising:
generating a fifth block by merging a plurality of blocks received by the second buffer module when a block size of the first block received by the first buffer module is less than a predetermined size; and
generating the predetermined logical block address based on a third logical block address of one of the blocks in the fifth block.

17. The method of claim 15, further comprising:
generating a plurality of blocks by splitting the third block received by the second buffer module when a block size of the first block received by the first buffer module is greater than a predetermined size,
identifying the blocks using identifiers having a predetermined number of bits; and
generating the predetermined logical block address by concatenating a plurality of least significant bits of a third logical block address with the bits of the identifiers.

18. The method of claim 15, further comprising:
converting (i) the third block or (ii) the fourth block into a fifth block, wherein the fifth block has a different data format than (i) the third block or (ii) the fourth block;
storing the fifth block in a third buffer module; and
converting the fifth block received by the third buffer module into a sixth block, wherein the sixth block has data format of (i) the third block or (ii) the fourth block.

19. The method of claim 18, wherein the sixth block includes third data, and the method further comprises:
generating a fourth checksum based on (i) the third data and (ii) the predetermined logical block address; and
determining whether the fifth block received by the third buffer module is different than the third block received by the second buffer module depending on whether the fourth checksum is different than the third checksum.

20. The method of claim 19, wherein the fifth block includes fourth data, and the method further comprises:
generating a fifth checksum based on (i) the fourth data and (ii) the predetermined logical block address or a physical block address and to generate a seventh block, wherein the seventh block includes (i) the fourth data and (ii) the fifth checksum;
generating an eighth block by encoding the seventh block using an error-correcting code; and
writing the eighth block on a storage medium of a data storage device.

* * * * *